United States Patent
Ryum et al.

[11] Patent Number: 5,962,879
[45] Date of Patent: Oct. 5, 1999

[54] SUPER SELF-ALIGNED BIPOLAR TRANSISTOR

[75] Inventors: Byung-Ryul Ryum; Deok-Ho Cho; Tae-Hyeon Han; Soo-Min Lee; Kwang-Eui Pyun, all of Daejeon, Rep. of Korea

[73] Assignee: Electronisc and Telecommunications Research Institute, Daejeon, Rep. of Korea

[21] Appl. No.: 08/854,665

[22] Filed: May 12, 1997

Related U.S. Application Data

[62] Division of application No. 08/758,256, Nov. 27, 1996.

[30] Foreign Application Priority Data

Dec. 20, 1995 [KR] Rep. of Korea ............. 95-52694

[51] Int. Cl.[6] ............................. H01L 29/737
[52] U.S. Cl. ................. 257/198; 257/197; 257/616
[58] Field of Search .................. 257/197, 198, 257/616; 438/317, 320

[56] References Cited

U.S. PATENT DOCUMENTS

| | | | |
|---|---|---|---|
| 5,365,090 | 11/1994 | Taka et al. | 257/197 |
| 5,459,084 | 10/1995 | Ryum et al. | 257/197 X |
| 5,484,737 | 1/1996 | Ryum et al. | 438/318 |
| 5,508,537 | 4/1996 | Imai | 257/197 |
| 5,620,907 | 4/1997 | Jalali-Farahani et al. | 438/320 |
| 5,691,546 | 11/1997 | Morishita | 257/19 |
| 5,696,007 | 12/1997 | Ryum et al. | 438/320 |
| 5,798,277 | 8/1998 | Ryum et al. | 438/318 |

FOREIGN PATENT DOCUMENTS 550 962 A2  7/1993  European Pat. Off. ............. 257/197

OTHER PUBLICATIONS

Prinz, et al., "The Effects of Base Dopant Outdiffusion and Undoped Si(1–x)Ge(x) Junction Spacer Layers in Si/Si(1–x)Ge(x)/Si Heterojunction Bipolar Transistors," IEEE Electron Device Letters, vol. 12, No. 2, Feb. 1991, pp. 42–44.

Sato et al., "Sub–20 ps ECL Circuits with High–Performance Super Self–Aligned Selectively Grown SiGe Base (SSSB) Bipolar Transistors," IEEE Trans. on Electron Devices, vol. 42, No. 3, Mar. 1995, pp. 483–487.

Primary Examiner—John Guay
Attorney, Agent, or Firm—Antonelli, Terry, Stout & Kraus, LLP.

[57] ABSTRACT

The invention relates to a method for manufacturing a super self-aligned heterojunction bipolar transistor which is capable of miniaturizing an element, simplifying the process step thereof by employing a selective collector epitaxial growth process without using a trench for isolating between elements. According to the invention, isolation between elements is derived by using a mask defining an emitter region and a second spacer. The base layer has multi-layer structure being made of a Si, an undoped SiGe, a SiGe doped a p-type impurity in-situ and Si. Also, the selective epitaxial growth for a base is not required. Thus, it can be less prone to a flow of leakage current or an emitter-base-collector short effect.

8 Claims, 5 Drawing Sheets

5,962,879

SUPER SELF-ALIGNED BIPOLAR TRANSISTOR

This application is a Division of application Ser. No. 08/758,256, filed Nov. 27, 1996.

FIELD OF THE INVENTION

The present invention relates to a super self-aligned bipolar transistor and, more particularly, to a super self-aligned heterojunction bipolar transistor manufactured through the use of a selective collector epitaxial growth process.

BACKGROUND OF THE INVENTION

In general, operating speed becomes faster as a homojunction bipolar transistor size decreases. However, since an impurity concentration between emitter and base should be increased, enhancement of characteristics of the transistor based on a structure of such element is a difficult task.

There have been proposed heterojunction bipolar transistors to cope with the above disadvantage.

Such a heterojunction bipolar transistor has a structure in which the energy bandgap of an emitter is larger than that of a base. For this reason, the heterojunction bipolar transistor shows an improvement of the performance of element and various design effects in comparison to the homojunction bipolar transistor.

As a conventional homojunction silicon bipolar transistor, the prior art heterojunction bipolar transistors utilize a polysilicon thin film as both a base electrode and a impurity diffusion source for an emitter.

Thus, using Ge instead of Si on the base layer, a difference between the energy bandgap of the emitter and that of the base is made to increase an emitter implantation efficiency, then the base is grown to a high doping concentration ultra-thin film, thereby enhancing a current gain and a switching speed of the device.

Recently, according as the optimization and the miniaturization of the structure of element, various methods have been used to minimize several parasitic components such as base resistance at an active region of the element and parasitic capacitance between a collector and a base.

Examples of such various methods include trench isolation, local oxidation of silicon( "LOCOS"), selective epitaxial growth("SEG") of a SiGe base thin film, and selective epitaxial growth for a Si emitter and so on.

Using the methods described above, there have been developed a super self-aligned Si/SiGe heterojunction bipolar transistor which self-aligns the base and emitter to reduce a base parasitic resistance, or self-aligns both the base-emitter and collection-base.

Furthermore, in order to further reduce the base parasitic resistance resulting from the poly-silicon thin film forming a base electrode material, a manufacturing process using a metallic thin film, for example titanium silicide, instead of the polysilicon thin film has been developed.

The above local oxidation of silicon method has a shortcoming in that a bird's beak shaped thermal oxidation film is formed horizontally as a thickness of a vertical silicon thermal oxidation film, resulting in a limitation of geometric reduction of the element.

FIG. 1 shows an exemplary super selfaligned Si/SiGe heterojunction bipolar transistor which utilizes the selective epitaxial growth method for a SiGe base thin film without using the LOCOS method.

FIG. 1 shows a cross-sectional view of npn Si/SiGe heterojunction bipolar transistor formed by self-aligning the collector-base using the prior art selective base epitaxial growth, after the growth of a base thin film.

An $n^+$ buried silicon collector layer (1-2) is first formed on a p-type silicon substrate (1—1), and an n-silicon collector layer (1-3) is then grown on the buried collector layer (1-2).

Subsequently, a collector junction portion (1-4) is formed by implanting an n-type impurity ion thereon, and then a trench is formed by a dry etching method to isolate elements, and, in turn, filling therein with Boron Phosphorous Silica Glass("BPSG") insulating thin film (1-5) made of boron B and phosphorous P. The BPSG insulating thin film (1-5) is then flattened under a high pressures.

In an ensuing step, an insulating film (1-6), a $P^+$ polysilicon film (1-7), an insulating film (1-8) and a sidewall insulating film (1-9) are formed by depositing and etching methods as shown in FIG. 1, and an n-type collector region (1-10) for improving characteristics of elements in a high current region is then formed by selectively ion implanting to only an active region of the element.

In a subsequent step, a SiGe base layer (1-11) is selectively grown on only an exposed portion in the collector region (1-10) and the polysilicon film (1-7), through the use of Gas Source Molecular Beam technique, and then a polysilicon film (1-12) is selectively grown on the remaining space, thereby accomplishing junction between the polysilicon film (1-7) for a base electrode and the SiGe base layer (1-11).

Accordingly, self-alignment between the collector and the base can be performed, since a parasitic capacitance region formed between the collector and the base is limited to only portion of a polysilicon thin film (1-12) without being defined by a photoresist.

Since, however, the parasitic capacitance region defined by the polysilicon thin film (1-12) is determined from a horizontal wet etching for the insulating film (1-6), resulting in reduced efficiency of the manufacturing process in regards to uniformity and reproduction thereof, thus entailing the fatal degradation of the performance of the device.

In addition, the prior art method has a disadvantage that since the low speed selective epitaxial growth method is applied twice during the growth of the SiGe base layer (1-11) and the poly-silicon thin film (1-12), and two thin films for example, the SiGe base (1-11) and the polysilicon (1-12), are used during the growth process thereof, resulting in a complicated manufacture process, and further, even if the polysilicon thin film (1-12) is slightly grown on the base layer (1-11), it causes the fatal degradation of element performance, thereby making it difficult to control the process thereof. Thus, the prior art method can hardly accomplish an effective manufacturing process.

Furthermore, as shown in FIG. 1, the prior art method has a shortcoming in that a trench structure for isolating elements is not deeply formed so as to prevent the collector junction portion (1-4) from contacting between elements via the—collector thin film (1-3) on the n+ buried Si collector layer (1-2) formed at the entire surface of a substrate, resulting in a larger space requirement to fill with the insulating thin film (1-5), thus entailing a bulkier element.

FIG. 2 shows a cross-sectional view of Si/SiGe heterojunction bipolar element manufactured by another prior art method, after the growth of a base thin film.

In the prior art shown in FIG. 2, both the base and the collector thin films are grown through the use of selective epitaxial growth method in contrast with the trench structure previously described, to thereby provide simplified and integrated manufacture processes.

In FIG. 2, an n'-type collector (2—2) is first formed on a p-type substrate (2-1), and then an insulating thin film (2-3) and a polysilicon thin film (2-4) for a base electrode are subsequently deposited thereon, and thereafter, a base electrode region is defined by a photoresist mask and etching the poly-silicon thin film (24).

Then, an insulating thin film (2-5) is deposited thereon, and then the photoresist mask, the insulating thin film (2-5), the poly-silicon thin film (2-4) and the insulating thin film (2-3) are defined as an active region by an etching process.

Subsequently, an n-type silicon layer (2-6) for a collector, a SiGe layer (2-7) for a base, and a silicon layer (2-8) for an emitter are grown through the application of an impurity thereon.

During the growth of the layers, (2-6), (2-7), and (2-8), as shown in FIG. 2, poly-crystal or amorphous silicon thin films, (2-6-1), -(2-7-1) and (2-8-1), are formed at each side thereof, respectively.

Thereafter, a silicide thin film (2-9) for a collector metal junction is formed, and a metal electrode (2-10) is then deposited to thereby obtain an element.

However, the above element suffers from a drawback in that, since a current path passing via a sequence of the amorphous silicon thin films, (2-8-1), (2-7-1) and (2-6-1) occurs, it is prcne to a short between the collector and the emitter.

Likewise, current paths passing through a sequence of the amorphous silicon thin films (2-8-1), (2-7-1), (2-61) and the n-type Si thin film (2-6), or a series of the thin film (2-6), the thin films, (2-7-1) and (2-6-1) may occur, thereby causing emitter-base and a base-collector shorts.

SUMMARY OF THE INVENTION

It is, therefore, an object of the present invention to provide a super self-aligned bipolar transistor which is reduced in size, and simplified in the fabricating process thereof by utilizing a selective collector epitaxial growth, without designing a trench for isolating between elements, thereby improving the performance thereof.

In accordance with the present invention, there is provided a super self-aligned heterojunction bipolar transistor, which comprises a semiconductor substrate having a buried collector; a first oxidation film and a conducting thin film for a base electrode formed on the substrate; a collector surrounded by the conducting thin film and formed on the buried collector in an active region of the transistor defined by patterning the conducting thin film and the first oxidation film; a first spacer formed at both sides of the conducting thin film surrounding the collector; a multi-layer base formed in the active region on the above semi-finished structure; an emitter selectively grown on the base in an emitter region of the transistor defined by etching a second oxidation film; a second spacer formed at both sides of the second oxidation film surrounding the emitter; an emitter electrode formed on the emitter; a passivation insulating layer formed on an entire surface of the above semi-finished structure; and metallic interconnections formed on the base, the emitter electrode and the buried collector, passing through the passivation insulating layer, and/or the first and the second oxidation film, respectively.

Preferably, the semiconductor substrate is composed of single silicon substrate, a heterojuction substrate being made of Si/ SiGe/ Ge, or a heterojuction substrate being made of Si/ diamond/ Si or Ge.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 3:
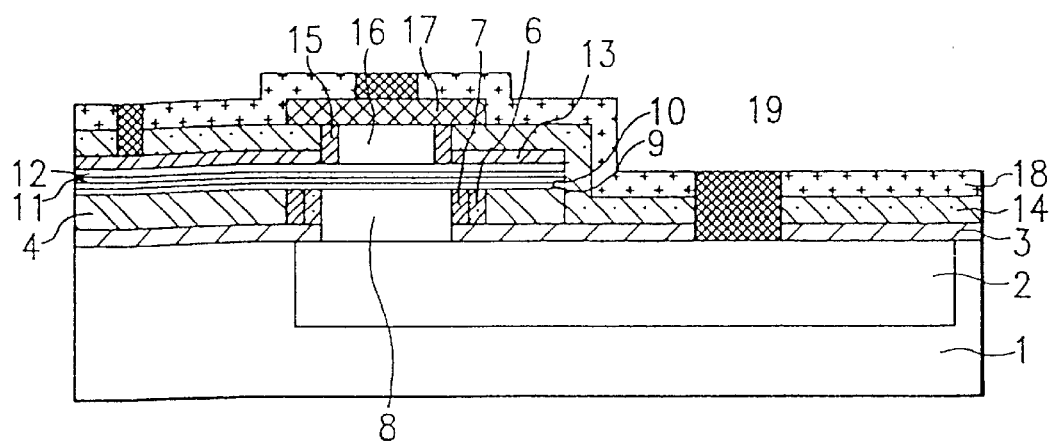
FIG. 3 explains a cross-sectional view of a super self-aligned bipolar transistor manufactured in accordance with a preferred embodiment the present invention.

FIG. 3 shows a cross-sectional view of a super selfaligned bipolar transistor formed of a selective collector growth method in accordance with a preferred embodiment the present invention.

In FIG. 3, a buried collector 2 is first formed on a semiconductor substrate 1, and then a first oxide film 3 and a conducting thin film 4 for a base electrode are sequentially formed thereon. Then, the semiconductor substrate 1 is preferably composed of single silicon substrate, a heterojuction substrate being made of Si/ SiGe/Ge, or a heterojuction substrate being made of Si/diamond/Si or Ge. Also, the conducting thin film 4 is generally formed of polysilicon of high concentration.

Then, a collector layer 8 is formed at an active region of transistor defined by patterning the conducting thin film 4 and the first oxide film 3, and a first spacer is formed at both sidewalls of the conducting thin film 4 surrounding the collector layer 8. Preferably, the first spacer is formed by a double layer with a different etching rate to thereby improve the reliability of the transistor, such as silicon nitride film 6 and silicon oxide film 7.

On the above semi-finished structure, a base layer and a second oxide film 14 are formed sequentially. The base layer includes a double-layer being made of Si/ SiGe, or multi-layer structure being made of Si 9/ undoped SiGe 10/doped SiGe I1/ Si 12. At this time, a silicide layer 13 is further provided between the base layer and the second oxide film 14, to decrease parasitic resistance interface thereof.

An emitter layer 16 is selectively grown in an emitter region defined by etching the second oxide film 14 and/or the silicide layer 13, and a second spacer 15 is formed at both sidewalls of the second oxide film 14 and/or the silicide layer 13 surrounding the emitter layer 16. An emitter electrode 17 is formed on the emitter layer 16. A passivation oxide layer 18 is deposited on the above semi-finished structure, and then metallic interconnections 19 are formed on the base layer, the emitter electrode '17 and the buried collector 2 through the passivation oxide layer 18 and/or the first and second oxide layers 3, 14.

In comparison with the above-mentioned methods( see, FIGS. 1 and 2), details of advantages of the present invention will be illustrated below with reference to FIG. 3.

Figure 1:
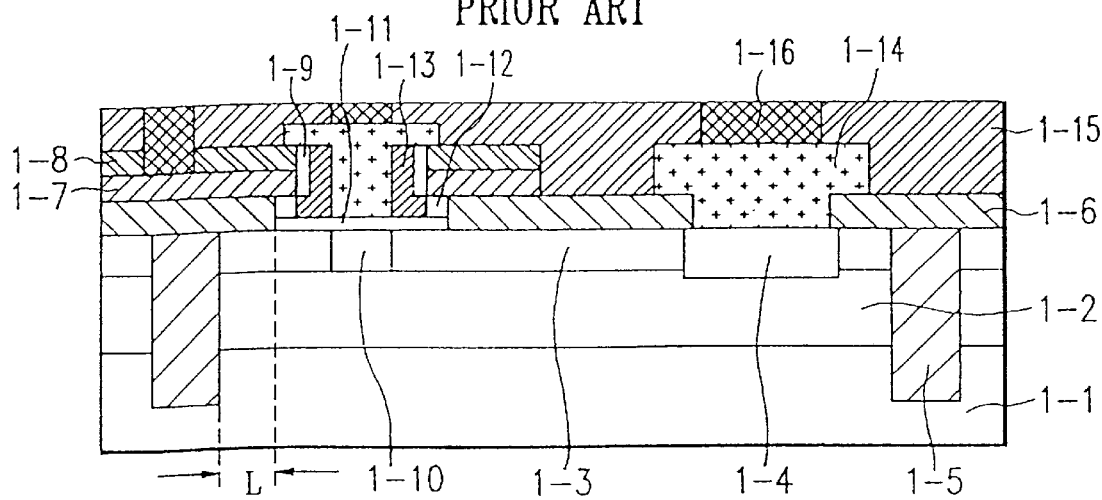
FIG. 1 shows a cross-sectional view of a prior art super self-aligned npn Si/SiGe heterojunction bipolar transistor which utilizes a selective base epitaxial growth method.

Firstly, a trench structure to isolate the elements should be deeply formed so as to prevent the collector junction portion (1-4) from contacting with elements through the n- Si collector layer (1-3), in the n+ buried Si collector layer (1-2) deposited on the entire surface of the substrate, as shown in FIG. 1.

Figure 2:
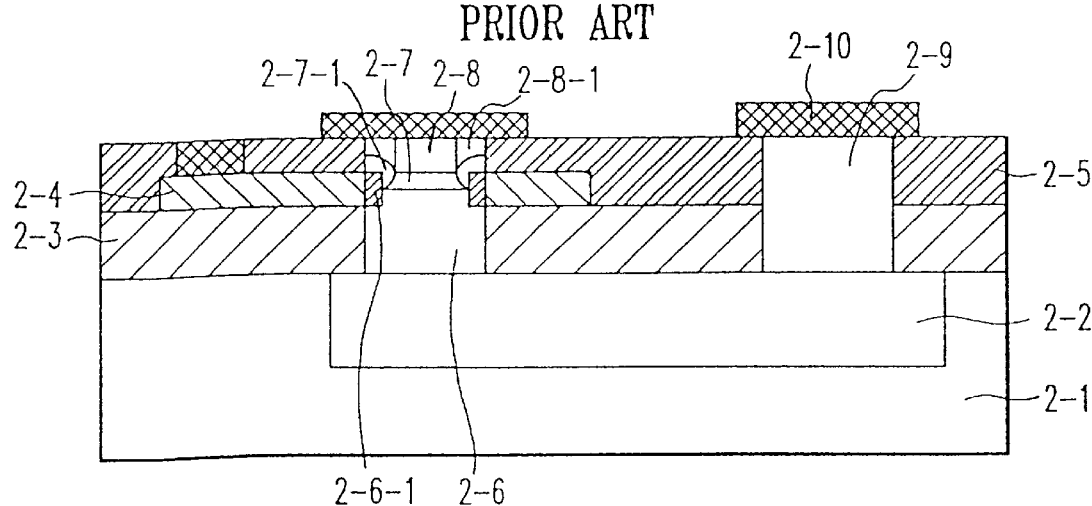
FIG. 2 offers a cross-sectional view of a heterojunction bipolar transistor which is self-aligned between the collector and base by using another prior art method previously described, after the growth of a base thin 15 film.

As a result, a plane area for filling with the BPSG insulating thin film (1-5) is increased to thereby entail a bulkier element but, since each of the collector thin film (2-6) and a collector thin film 8 is separated from each other by the insulating thin film (2-3), as shown in FIGS. 2 and 3, respectively, the trench process to isolate between elements in FIG. I may be eliminated.

Likewise, since each of self-alignments of base-collector and emitter-base are performed so that each of the emitter, the base and the collector has the same area as the others, it is possible to switch upward/downward operating modes, thereby reducing parasitic capacitance between the base and the collector, and to self-align the emitter and the base. Thus, cancellation of a process for isolating between elements results in a smaller element and a further simplified process step.

Secondly, in FIGS. 2 and 3, a useless region in FIG. 1 (which is indicated by length L) is eliminated to decrease the size of the element, resulting in a possibility of high integration and a reduction of parasitic capacitance between an n' buried collector and a p-type substrate, thereby making it possible to enhance an operating speed of the element.

On the other hand, in comparison with the prior art element shown in FIG. 2, merits of the element shown in FIG. 3 will be discussed below.

In the element presented in FIG. 2, since a current path passes through via a sequence of the amorphous silicon thin films, (2-8-1), (2-7-1) and (2-6-1), it can be prone to a collector—emitter short effect not related to a leakage current.

Similarly, since a current path passing through a sequence of the amorphous silicon thin films, (2-8-1), (27-1), (2-6-1) and the n-type silicon thin film (2-6), or a series of the n-type silicon thin films, (2-6), (2-7-1) and (2-6-1) occurs, emitter-base and base-collector short effects may occur. Consequently, in practice, the element associated with the structure shown in FIG. 2 is difficult to accomplish.

Furthermore, when the n-type silicon thin film (2-6), i.e., collector thin film, is selectively grown, since the thin film (2-6-1) is grown from sides of the collector thin film (2-6), the thicker the collector thin film (2-6) is the more the thin film (2-6-1) on the sides thereof is. As a result, a sequence of simple-crystal thin films, (2-8), (2-7), (2-6) and (2-2), to be defined as an active region in the element may not be clearly determined.

In addition to the growth of both of the SiGe thin film (2-7) and the silicon thin film (2-8), since the thin films, (2-7-1) and (2-8-1), are also grown, a width of the active region in the element depends on a thickness of a sequence of the thin films, (2-6), (2-7) and (2-8).

In contrast to the element disclosed previously, the element in accordance with the present invention prevents a poly-crystalline thin film from growing by situating a first spacer 6 and/or 7, between a polysilicon thin film 4 for a base electrode and a selectively grown collector layer 8, thereby making it possible to clearly define the active region in the element as defined by a mask.

According to the invention, isolation between an emitter layer 16 and the poly-crystal thin films is derived by using a mask defining an emitter region and a second spacer 15. Thus, the invention can be less prone to a flow of leakage current or an emitter-base-collector short effect.

Secondly, when a single p-type SiGe thin film is used as a base as shown in FIG. 2, a p-type impurity within the base thin film, during the growth of the emitter layer (28), may be diffused to the collector and the emitter adjacent to the base, respectively.

Thus, discordance occurs between a junction face of a sequence of the emitter thin film (2-8), the SiGe base thin film (2-7) and the n-type silicon collector thin film (2-6), i.e., a sequence of emitter-base-collector, and a junction face by the npn impurity. As a result, a parasitic electric potential is created at the junction faces between the emitter-base and between the collector-base, hence the parasitic electric potential prevents an electron from transferring from the emitter to the collector, thereby degrading performance factors of the element such as a current amplification factor and a cutoff frequency and so on.

Conversely, in the present invention, in order to overcome the degradation of the performance factors depending on generation of such parasitic electric potential, the base layer has a multi-layer structure including Si 9, undoped SiGe 10, SiGe 11 doped with a ptype impurity in-situ and Si 12.

Thirdly, in the prior art element, since the collector thin film in a high speed element is designed to be thin, the base electrode film (2-4) shown in FIG. 2 is designed to be thin so that a parasitic resistance resulting from the base electrode film (2-4) is further increased, but the present invention provides a silicide layer 13 to minimize the parasitic resistance as shown in FIG. 3.

Fourthly, in order to provide high speed when a thickness of the collector thin film (2-6) is decreased, the insulating thin film (2-3) should be also decreased in thickness, thus entailing a reduction of breakdown voltages between the thin film (2-4) and the thin film (2-6-1) and between the thin film (2-4) and the collector thin film (26). In accordance with the present invention, even though a thickness of the collector layer 8 is decreased depending on the first spacer 6 and 7, the breakdown voltage between the base layer 4 and the collector layer 8 is not decreased.

Fifth, in the structure shown in FIG. 2, since a selective epitaxial growth process is used to grow the SiGe thin film (2-7), it has a shortcoming in that it is difficult to manufacture and it has a cumbersome process, thereby degrading overall productivity. In addition, the prior art structure causes the increment of parasitic resistance due to a junction between the base electrode (24) and the base thin film (2-7)made at sides thereof.

In accordance with. the present invention, the selective epitaxial growth for a base is not required, resulting in the reduction of processing time and a contact between the multi-layer thin film for the base on the conducting thin film 4 for the base electrode, to thereby prevent the parasitic resistance in the base thin film from increasing.

As described hereinabove, in accordance with a preferred embodiment present invention, it is possible to cope with the above disadvantages according to the elimination of element isolation region in a chip and an ion implantation, and to control the parasitic capacitance between the collector and the base, and further to significantly reduce the parasitic capacitance between the emitter and the base and the parasitic resistance in the base through self-alignment between the base and the emitter, thereby improving an operating characteristics of element in a high frequency bandwidth.

Hereinafter, the manufacturing method of a super self-aligned bipolar transistor in accordance with the present invention will be described with reference to FIGS. 4(A) to 4(I).

Figure 4A:
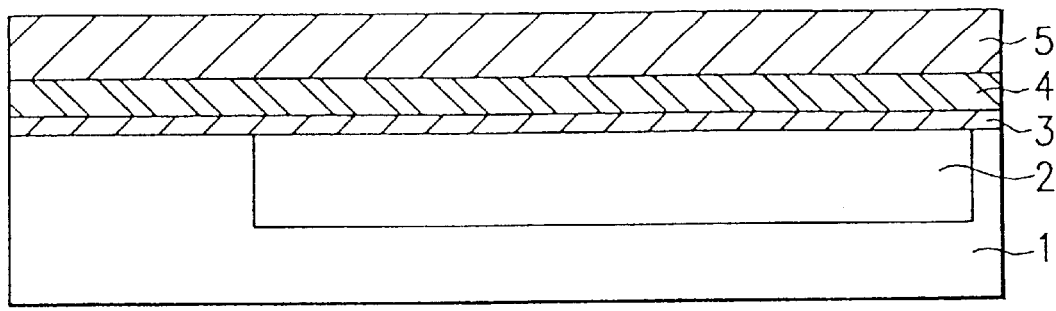
FIGS. 4(A) to 4(I) exhibit a schematic cross-sectional views setting forth the manufacturing steps for the super self-aligned bipolar transistor in accordance with a preferred embodiment the present invention.

FIG. 4(A) shows a p-type semiconductor substrate 1 having a buried collector 2. The semiconductor substrate 1 is preferably composed of a single silicon substrate. Also, the substrate can be composed of a heterojunction substrate including Si/ SiGe/ Ge, or including Si/ diamond thin film/Si. The above buried collector 2 is generally formed by photolithography, ion implantation and annealing process.

Next, a first silicon oxidation film 3 is deposited thereon.

Subsequently, a p-type conducting thin film 4 for a base electrode such as polysilicon, SiGe and Ge is formed by using a chemical vapor deposition(CVD) method followed by an impurity ion implantation in-situ. Thereafter, a second silicon oxidation film 5 is deposited on the conducting thin film 4.

Figure 4B:
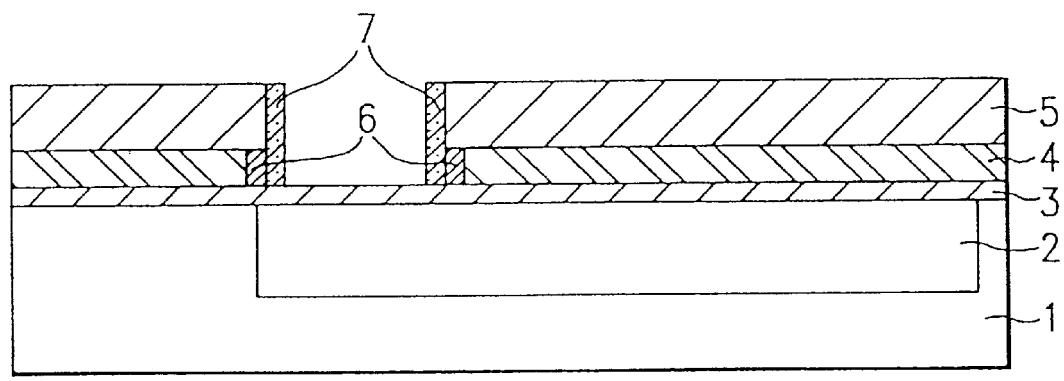

In FIG. 4(B), the second silicon oxidation film 5 is etched by using a photoresist mask defining an active region in the element, and then the photoresist is removed.

Then, the conducting thin film 4 is wet etched to form a undercut portion, and then thermal oxide layer 6, for a first spacer formation, is formed by thermal oxidation in the undercut portion of the conducting film 4, and a silicon nitride film 7 for the first spacer is then deposited thereon.

Thereafter, the silicon nitride film 7 remains only at the sides thereof by using anisotropic dry etching.

Figure 4C:
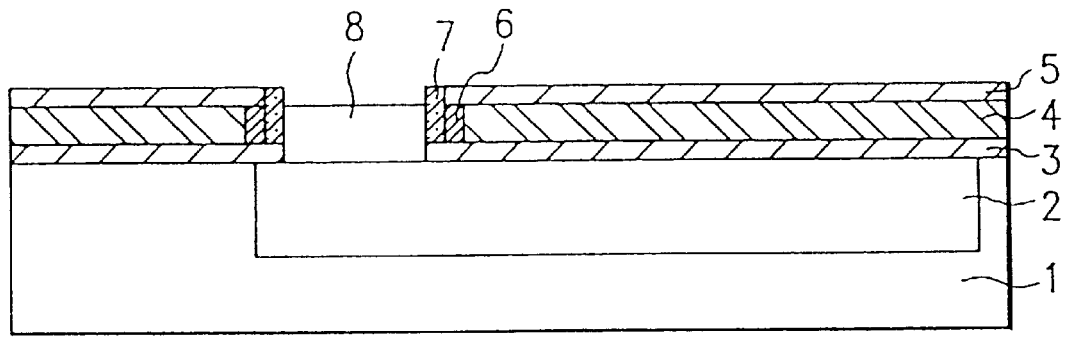

In FIG. 4(C), the first oxide layer 3 is further etched, and the second oxide layer 5 is also etched to be the same as the etched thickness of first oxide layer 3. A single crystal silicon, collector layer 8 is selectively grown on the exposed buried collector 2.

Then, the single crystal thin film 8 is doped by adding an n-type impurity or an ion implantation and the heat treatment after the growth of thin film.

Figure 4D:
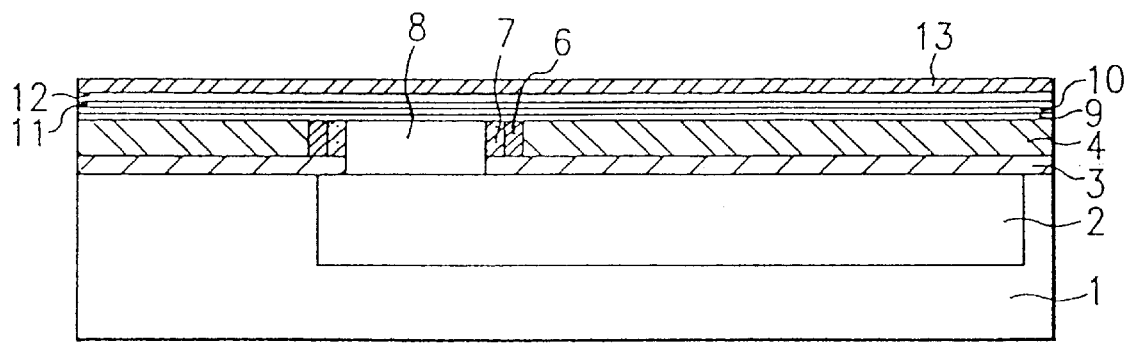

In FIG. 4(D), the second oxide layer 5 is etched. The silicon nitride film 7 is also etched to the same thickness as the silicon oxidation film 5. Then, thermal oxidation process further protects a surface of collector layer 8 from the above etching process.

Thereafter, a heterojunction base layers are formed, that is, a silicon thin film 9, an undoped SiGe thin film 10, a SiGe thin film 11 doped a p-type impurity in-situ and a silicon thin film 12 are subsequently grown on the exposed p-type polycrystal silicon thin film 4 and the single crystal thin film 8.

In the above steps, an impurity is added to the SiGe thin film 10 when the SiGe thin film 10 is epitaxialy grown in-situ, wherein the impurity added to the silicon thin film 12 is any one of the n-type or the p-type impurities.

In addition, the thin films 10 and 11, or all of the thin films 10, 11 and 12, may be replaced with a doped ptype silicon thin film doped in-situ, the exception of the silicon thin film 9. In the above step, a polycrystalline thin film is grown on the polysilicon thin film 4, and the first spacer 6 and/or 7, while the single-crystalline thin film is grown on the collector layer 8.

Additionally, a metal or a metallic siliside for example, a titanium siliside, TiS'2.X(X is 0 to 9) 13 is deposited on the top layer 12 of base by sputtering.

Figure 4E:
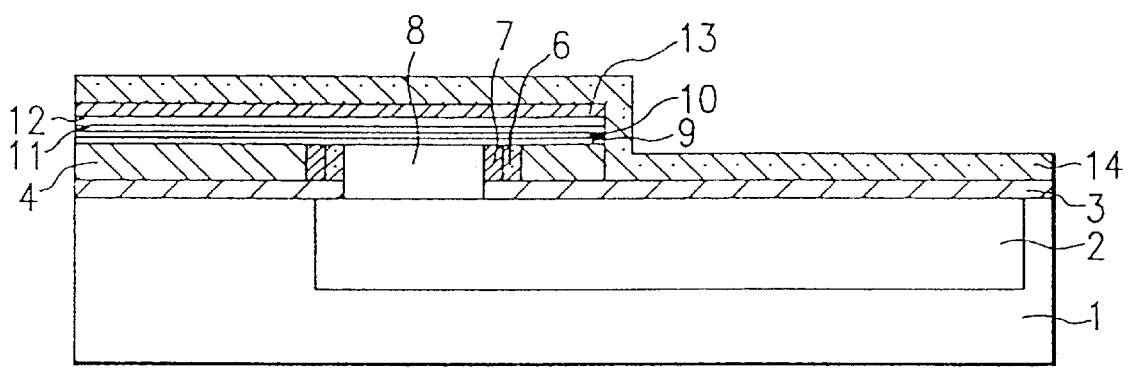

In FIG. 4(E), a non-active region of the transistor that is, the silicide layer 13, the base layers 12-9, and the polysilicon layer 4 are etched by using as a mask defining a base electrode, and then a silicon oxidation film 14 is deposited thereon.

Figure 4F:
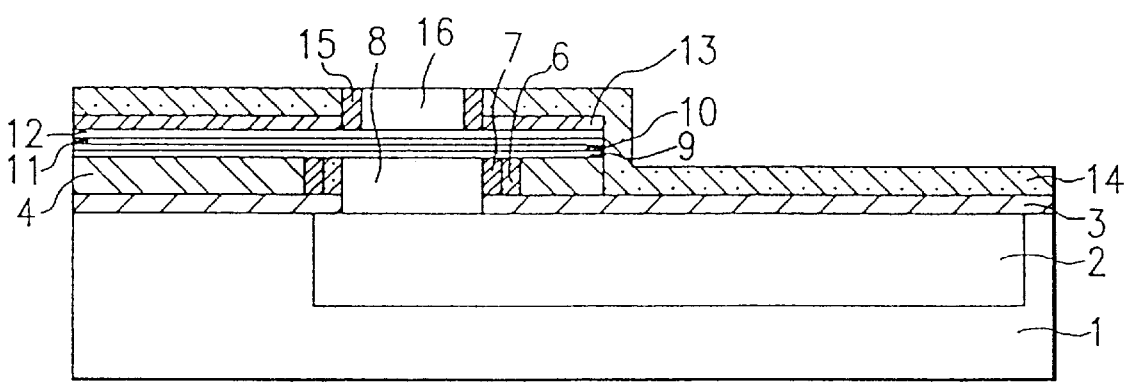
Figures 1, 4F:
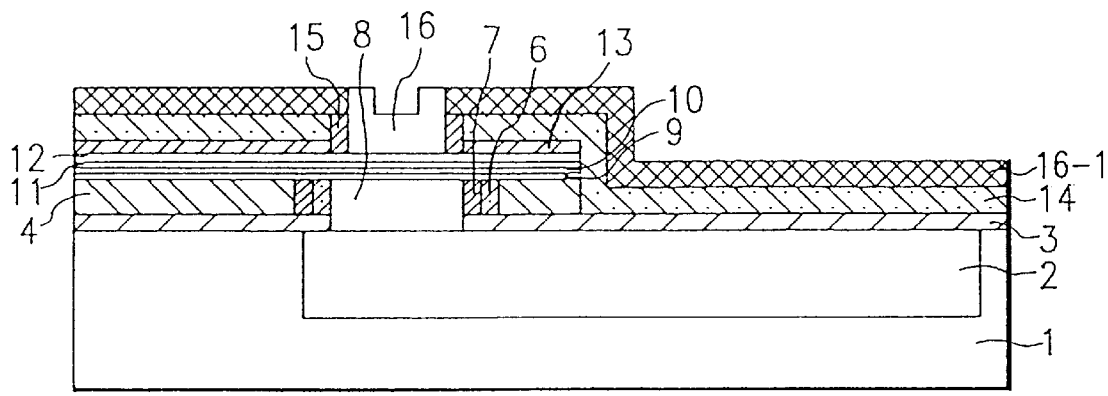

In FIG. 4(F), the silicon oxidation film 14 and the silicide layer 13 are etched by using a photoresist pattern as a mask defining an emitter region.

Next, a silicon oxide is deposited thereon, and a second spacer 15 is formed on both sides of the silicide 13 and the silicon oxidation film 14 by using the anisotropic etching.

Subsequently, an n-type silicon thin film 16 for an emitter doped in-situ is selectively deposited at the silicon oxidation film 15.

In FIG. 4(F'), a n-type silicon thin film 16 for emitter doped in-situ is entirely deposited in contrast to the structure shown in FIG. 4(F).

Figure 4G:
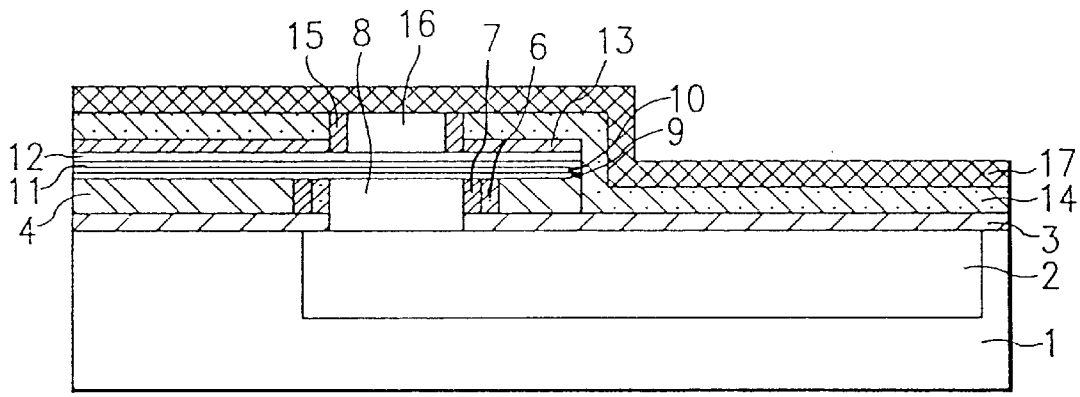
Figures 1, 4G:
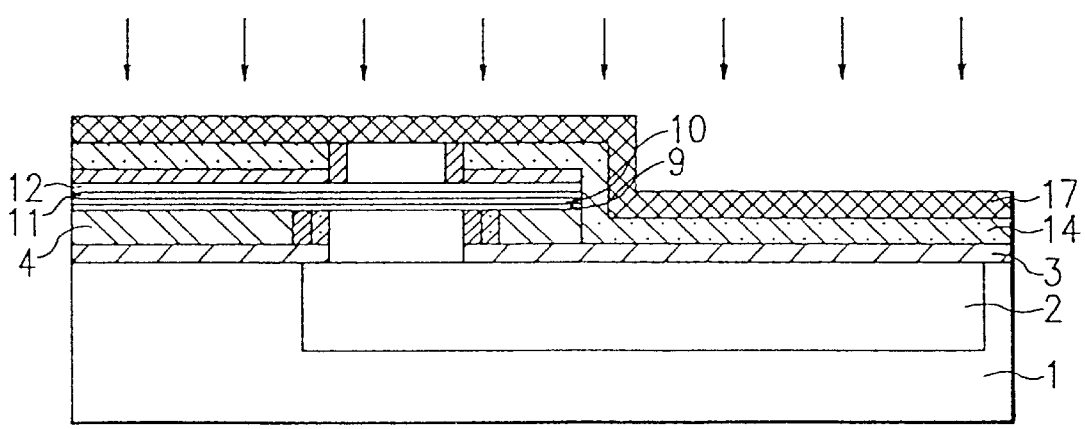

In FIG. 4(G), after the structure shown in FIGS. 4(F) and 4(F'), the polysilicon thin film 17 is deposited by adding a doped n-type impurity in-situ, or as shown in FIG. (G'), undoped polysilicon thin film 17 is deposited and then doped by ion implanting the n-type impurity.

Figure 4H:
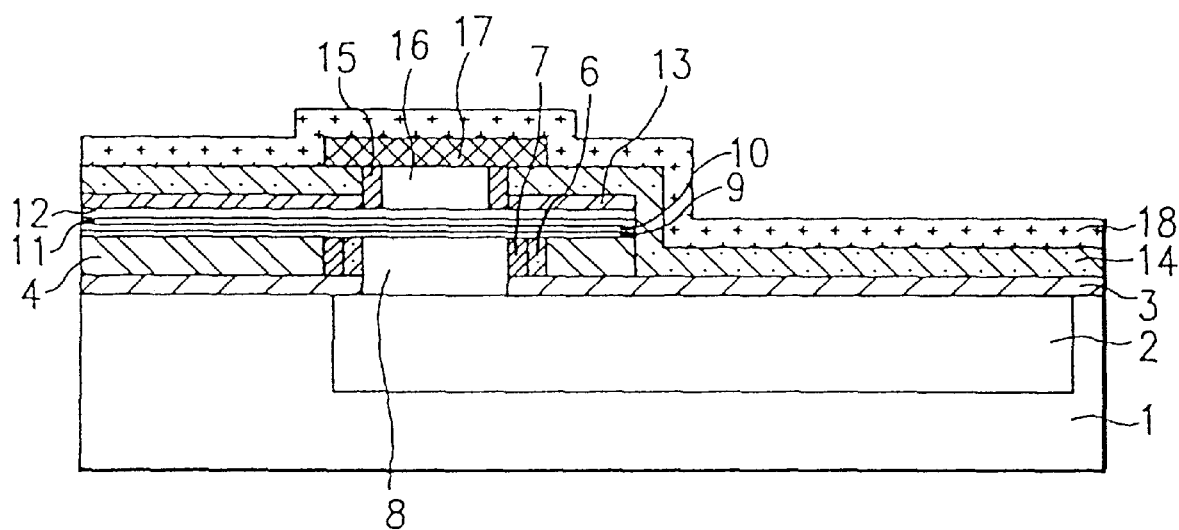

In FIG. 4(H), a polysilicon emitter electrode 17 is patterned by using a photoresist pattern, and then the photoresist pattern is removed. Thereafter, a passivation insulating layer i8 is deposited.

Figure 4I:
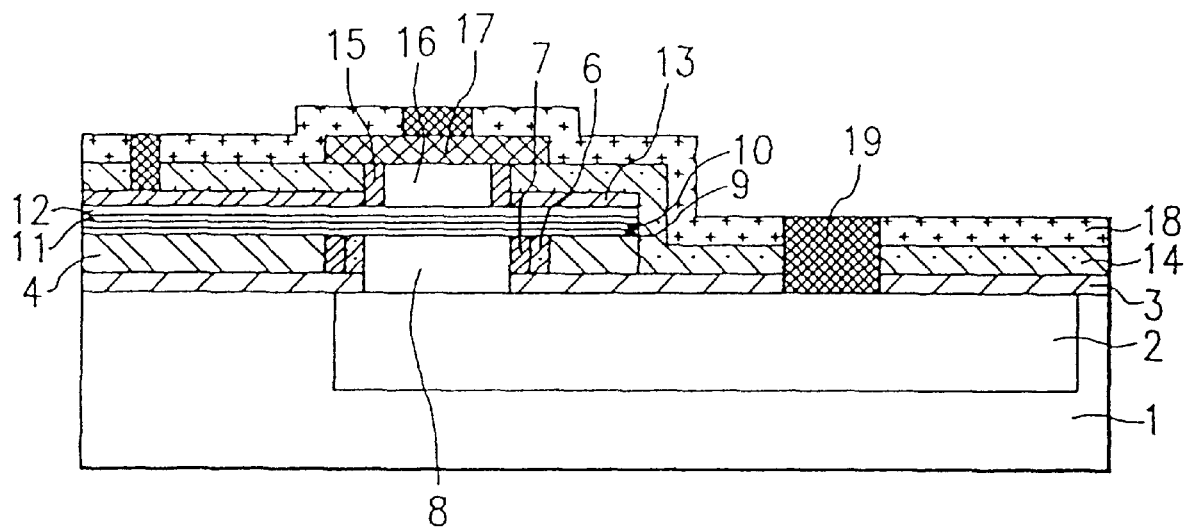

In FIG. 4(I), metallic interconnections 19 are formed on the base layer or the silicide layer 12, the emitter electrode 17 and the buried collector 2 through the passivation oxide layer 18 and/or the first and second oxide layers 3, 14.

As mentioned above, the present invention has an advantage in that an operating speed of bipolar transistor can be increased using a Si/SiGe heterojunction thin film structure, and a parasitic capacitance and a parasitic resistance of elements are reduced, and further the size of the element is reduced, to thereby provide high speed, high integration and a low power consumption.

Furthermore, the invention has further merit in that it further reduces the effects of a breakdown voltage between a collector and a base or between a collector and an emitter depending on decrement of a thickness of the collector, and it is easier to manufacture thereof, thereby improving productivity of element.

While the present invention has been described with respect to certain preferred embodiments only, other modifications and variations may be made without departing from the scope of the present invention as set forth in the following claims.

What is claimed is:

1. A super self-aligned heterojunction bipolar transistor, comprising:

a semiconductor substrate having a buried collector;

a first oxidation film and a conducting thin film for a base electrode formed on the semiconductor substrate;

a collector surrounded by the conducting thin film and formed on the buried collector in an active region of the transistor defined by patterning the conducting thin film and the first oxidation film;

a first spacer formed on both sides of the conducting thin film surrounding the collector;

a multi-layer base formed in the active region of the transistor;

an emitter selectively grown on the multi-layer base in an emitter region of the transistor defined by etching a second oxidation film;

a second spacer formed on both sides of the second oxidation film surrounding the emitter;

an emitter electrode formed on the emitter;

a passivation insulating layer formed on an entire surface of the transistor; and metallic interconnections formed on the base, the emitter electrode and the buried collector, passing through the passivation insulating layer and/or the first and the second oxidation film, respectively, wherein the first spacer is formed by a double layer including a silicon nitride film and a silicon oxide film with different etching rates to thereby improve performance thereof.

2. The bipolar transistor according to claim 1, wherein the semiconductor substrate is a silicon substrate.

3. The bipolar transistor according to claim 1, wherein the conducting thin film for the base electrode is a $P^+$-type polysilicon doped with impurity in-situ.

4. The bipolar transistor according to claim 1, wherein the conducting thin film for the base electrode is a $P^+$-type polysilicon doped with impurity in-situ.

5. The bipolar transistor according to claim 1, further comprising a silicide layer between the base and the second oxidation film.

6. A super self-aligned heterojunction bipolar transistor, comprising:

a semiconductor substrate having a buried collector;

a first oxidation film and a conducting thin film for a base electrode formed on the semiconductor substrate;

a collector surrounded by the conducting thin film and formed on the buried collector in an active region of the transistor defined by patterning the conducting thin film and the first oxidation film;

a first spacer formed on both sides of the conducting thin film surrounding the collector;

a multi-layer base formed in the active region of the transistor;

an emitter selectively grown on the multi-layer base in an emitter region of the transistor defined by etching a second oxidation film;

a second spacer formed on both sides of the second oxidation film surrounding the emitter;

an emitter electrode formed on the emitter;

a passivation insulating layer formed on an entire surface of the transistor; and metallic interconnections formed on the base, the emitter electrode and the buried collector, passing through the passivation insulating layer and/or the first and the second oxidation film, respectively, wherein the multi-layer base includes Si/undoped SiGe/doped SiGe/Si.

7. The bipolar transistor according to claim 6, wherein the semiconductor substrate is a silicon substrate.

8. The bipolar transistor according to claim 6, further comprising a silicide layer between the base and the second oxidation film.

* * * * *

UNITED STATES PATENT AND TRADEMARK OFFICE
CERTIFICATE OF CORRECTION

PATENT NO. : 5,962,879
DATED : October 5, 1999
INVENTOR(S) : Byung-Ryul Ryum, et al.

It is certified that error appears in the above-identified patent and that said Letters Patent is hereby corrected as shown below:

<u>Title page, Item [73],</u>
Assignee: replace "Electronisc and Telecommunications Research Institute, Daejon, Rep. of Korea" with -- Electronics and Telecommunications Research Institute, Daejon, Rep. of Korea and Korea Telecommunication Authority, Seoul, Rep. of Korea --.

Signed and Sealed this

Fourteenth Day of August, 2001

*Attest:*

*Attesting Officer*

NICHOLAS P. GODICI
*Acting Director of the United States Patent and Trademark Office*